US006243249B1

(12) United States Patent
Farman et al.

(10) Patent No.: US 6,243,249 B1
(45) Date of Patent: Jun. 5, 2001

(54) LIGHTNING STRIKE PROTECTION CIRCUIT BOARD ASSEMBLY

(75) Inventors: Brian Frederick Farman, Solihull; Steven John Webster, Dosthill, both of (GB)

(73) Assignee: Lucas Industries plc (GB)

( * ) Notice: Subject to any disclaimer, the term of this patent is extended or adjusted under 35 U.S.C. 154(b) by 0 days.

(21) Appl. No.: 09/312,530

(22) Filed: May 14, 1999

(30) Foreign Application Priority Data

May 23, 1998 (GB) .................................................. 9811062

(51) Int. Cl.[7] .................................. H01C 7/12; H02B 1/20
(52) U.S. Cl. ............................. 361/118; 361/827; 439/59
(58) Field of Search .................................. 361/111, 117, 361/118, 600, 627, 633, 679, 683, 56, 728, 736, 826, 827; 439/44, 52, 55, 59, 63, 92

(56) References Cited

U.S. PATENT DOCUMENTS

| | | | |
|---|---|---|---|
| 4,272,141 | * | 6/1981 | McKeen et al. ........................ 439/59 |
| 4,503,484 | * | 3/1985 | Moxon ................................. 361/736 |
| 4,701,696 | * | 10/1987 | Bogardus et al. .................... 324/757 |
| 4,758,924 | * | 7/1988 | Dillon et al. ......................... 361/692 |
| 5,364,287 | * | 11/1994 | Weber .................................. 439/358 |
| 5,388,995 | | 2/1995 | Rudy, Jr. et al. . |
| 5,539,801 | * | 7/1996 | Herh et al. .............................. 379/1 |
| 5,712,754 | * | 1/1998 | Sides et al. ............................ 361/58 |
| 6,061,806 | * | 5/2000 | Caldwell et al. ........................ 714/3 |

FOREIGN PATENT DOCUMENTS 195 43 016   5/1997   (DE) .

* cited by examiner

Primary Examiner—Michael J. Sherry
Assistant Examiner—Kim Huynh
(74) Attorney, Agent, or Firm—Andrus, Sceales, Starke & Sawall

(57) ABSTRACT

An electronic assembly is provided that has a housing receiving a motherboard arranged, in use, to carry control circuit components, and a circuit board carrying a lightning strike protection circuit, said circuit board including a first electrical connector, and the assembly further including a flexible cable electrically connected to the motherboard, the cable including a second electrical connector arranged to cooperate with said first electrical connector to electrically connect the lightning strike protection circuit to the motherboard, said first and second connectors being accessible from outside of the housing. The assembly may be used in aerospace applications.

5 Claims, 1 Drawing Sheet

LIGHTNING STRIKE PROTECTION CIRCUIT BOARD ASSEMBLY

FIELD OF THE INVENTION

This invention relates to an assembly intended for use in aerospace applications and intended to house electrical/electronic circuits forming part of the control system for the aircraft.

BACKGROUND OF THE INVENTION

There is a requirement to provide control circuits for an aircraft with lightning strike protection circuits in order to avoid damage to the control circuits in the event of the aircraft being struck by lightning. In a known electronic assembly, the lightning strike protection circuits are provided on circuit boards or cards which are mounted upon and electrically connected to a motherboard in the usual manner. It is desirable to be able to test the operation of the lightning strike protection circuits as, in normal use, these circuits are effectively dormant and so any faults could remain unnoticed for a long period of time. However, testing of the lightning strike protection circuits of the type described hereinbefore requires removal of the circuit boards or cards carrying the circuits from the motherboard, and this may require disassembly of a substantial portion of the assembly, thus testing is a relatively complex and time consuming operation.

SUMMARY OF THE INVENTION

According to the invention there is provided an electronic assembly comprising a housing receiving a motherboard arranged, in use, to carry control circuit components, and a circuit board carrying a lightning strike protection circuit, said circuit board including a first electrical connector, and the assembly further including a flexible cable electrically connected to the motherboard, the cable including a second electrical connector arranged to cooperate with said first electrical connector to electrically connect the lightning strike protection circuit to the motherboard, said first and second connectors being accessible from outside of the housing.

Such an arrangement is advantageous in that testing of the lightning strike protection circuit can be achieved by disconnecting the first and second connectors from one another and making alternative connections between the lightning strike protection circuit and appropriate test equipment without removing the circuit board carrying the lightning strike protection circuit from the housing.

Conveniently, the assembly further comprises a removable cover which can be mounted over the first and second connectors, in use, in order to restrict unauthorized access thereto.

BRIEF DESCRIPTION OF THE DRAWINGS

The invention will further be described, by way of example, with reference to the accompanying drawings, in which.

DESCRIPTION OF THE PREFERRED EMBODIMENTS

Figure 1:
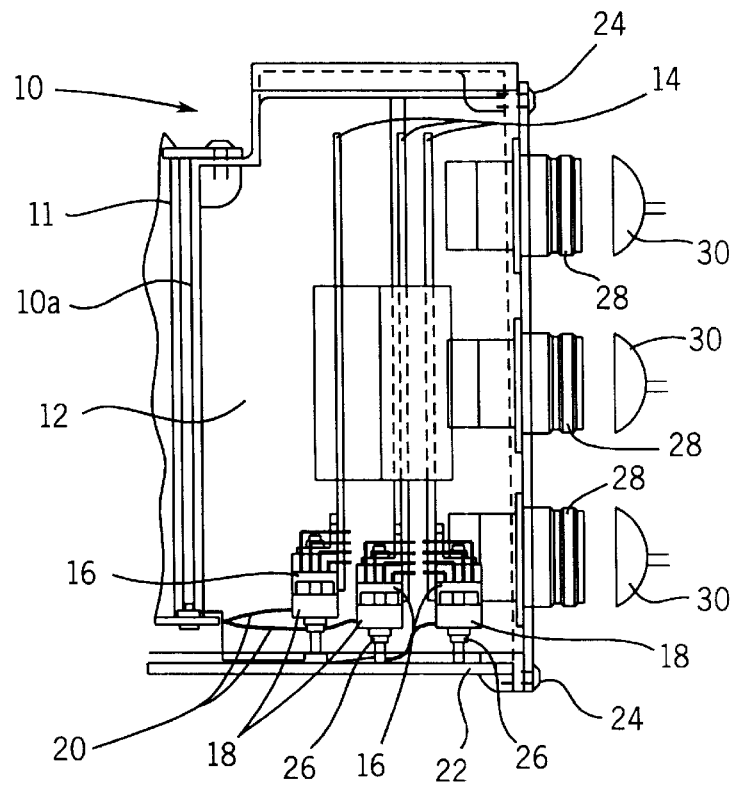
FIG. 1 is a sectional view illustrating part of an electrical assembly in accordance with an embodiment.
Figure 2:
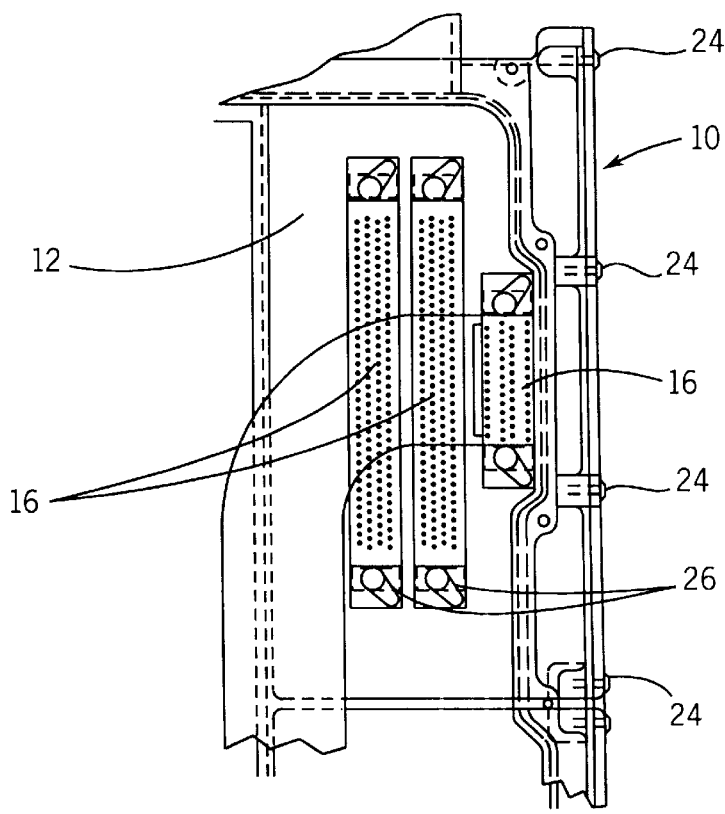
FIG. 2 is a view of the assembly from beneath with the cover plate removed.

The electronic assembly illustrated in the accompanying drawings comprises a housing 10 which includes internal walls 10a which divide the interior of the housing into a first compartment within which a motherboard is located, the motherboard 11 being arranged to cooperate, in use, with circuit boards or cards bearing electrical or electronic circuits intended for use in controlling the operation of an aircraft. The housing 10 further defines a second compartment 12 within which circuit boards or cards 14 bearing lightning strike protection circuits are mounted. The housing 10 may be of multipart construction, and the part of the housing defining the second compartment 12 may take the form of a module which is removable from the remainder of the housing 10.

The lower end of each card 14, in the orientation illustrated in FIG. 1, carries a socket 16 forming a first connector, the socket 16 including a plurality of electrical connector pins which are electrically connected to tracks defining part of the lightning strike protection circuit carried by the card 14. One convenient manner for securing the cards 14 in position is to rigidly mount the cards 14 to part of the wall of the housing 10 using appropriate bolts.

Plugs 18 forming second electrical connectors are arranged to cooperate with the sockets 16, the plugs 18 being electrically connected to the ends of respective cables 20, the other ends of the conductors of the cables 20 being electrically connected to circuits carried by the motherboard, for example using appropriate electrical connectors, or by soldering the conductors of the cables to appropriate conductive tracks carried by the motherboard. Conveniently, the plugs 18 and sockets 16 are of the type in which, when a plug 18 and socket 16 are connected to one another, a locking mechanism can be used to avoid accidental release of the plug 18 from the socket 16. The locking mechanism may take the form of one or more bolts 26, each of which is arranged to extend through an opening formed in the plug 18 and to cooperate with a screw threaded opening provided in the socket 16.

The part of the housing 10 adjacent the sockets 16 of the cards 14 defines an opening through which the sockets 16 can be accessed. A cover plate 22 is conveniently securable to the housing 10 to close the opening, thus restricting access to the sockets 16 and plugs 18, in use. In the embodiment illustrated herein, the cover plate 22 is secured to the housing 10 by means of screw-threaded bolts 24.

In normal use, the plugs 18 are secured to the sockets 16, thus electrically connecting the lightning strike protection circuits carried by the cards 14 to the remainder of the electrical or electronic circuits located within the housing 10 of the electronic assembly. The electrical connections between the circuits of the electronic assembly and the remaining control circuits of the aircraft are conveniently achieved through a series of sockets or other connectors 28 mounted in the wall of the housing 10 so as to be accessible from the exterior of the housing.

When the lightning strike protection circuits are to be tested, the external electrical connections 30 to the housing 10 are removed and the electronic assembly is removed from the aircraft. The cover plate 22 is removed from the housing 10, and the plugs 18 are removed from the sockets 16 after releasing the locking mechanism. The lightning strike protection circuits carried by the cards 14 can then be electrically connected to an appropriate test apparatus using the sockets 16 to permit testing of the circuits. Provided the circuits are operating correctly, after testing, the plugs 18 are reintroduced into the sockets 16, the cover plate 22 is secured in position to prevent access to the sockets 16 and plugs 18, and the electronic assembly is repositioned in the aircraft and connected once again to the remainder of the control circuits of the aircraft. Should a fault be detected, then the card 14 carrying the faulty circuit is replaced.

It will be appreciated that the electronic assembly of the present invention is advantageous in that testing of the lightning strike protection circuit can be achieved without removing the cards 14 carrying the lightning strike protection circuits from the housing 10. The test operation is therefore relatively simple to perform and can be performed relatively quickly.

In an alternative arrangement, when the electronic assembly is mounted in an aircraft in such a manner that the cover plate is accessible, the testing may take place without having to remove the electronic assembly for the aircraft. It will be appreciated that in these circumstances, prior to the commencement of testing, the circuits carried by the cards 14 are electrically isolated from the remainder of the electronic system of the aircraft, for example by removing external electrical connections from the assembly to the electronic system of the aircraft.

We claim:

1. An electronic assembly comprising a housing receiving a motherboard arranged, in use, to carry control circuit components, and a circuit board carrying a lightning strike protection circuit, said circuit board including a first electrical connector, and the assembly further including a flexible cable electrically connected to the motherboard, the cable including a second electrical connector arranged to cooperate with said first electrical connector to electrically connect the lightning strike protection circuit to the motherboard, said first and second connectors being accessible from outside of the housing and the housing having external connectors whereby detachable external electrical connections can be made to said circuit board and through said lightning strike protection circuit of said circuit board, said first and second electrical connectors and said flexible cable to said motherboard.

2. An assembly as claimed in claim 1, wherein the first connector is a socket and the second connector is a plug.

3. An assembly as claimed in claim 2, wherein locking means is provided that is adapted to lock the first and second connectors together in the connected condition, for avoiding accidental disconnection.

4. An assembly as claimed in claim 1, wherein locking means is provided that is adapted to lock the first and second connectors together in the connected condition, for avoiding accidental disconnection.

5. An assembly as claimed in claim 1, further comprising a removable cover which can be mounted over the first and second connectors, in use, in order to restrict unauthorized access thereto.

* * * * *